(12) United States Patent
Yudovsky et al.

(10) Patent No.: US 10,508,340 B2
(45) Date of Patent: Dec. 17, 2019

(54) ATMOSPHERIC LID WITH RIGID PLATE FOR CAROUSEL PROCESSING CHAMBERS

(71) Applicant: Applied Materials, Inc., Santa Clara, CA (US)

(72) Inventors: Joseph Yudovsky, Campbell, CA (US); Kevin Griffin, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 852 days.

(21) Appl. No.: 14/774,032

(22) PCT Filed: Mar. 14, 2014

(86) PCT No.: PCT/US2014/027196
§ 371 (c)(1),
(2) Date: Sep. 9, 2015

(87) PCT Pub. No.: WO2014/152311
PCT Pub. Date: Sep. 25, 2014

(65) Prior Publication Data
US 2016/0024655 A1    Jan. 28, 2016

Related U.S. Application Data

(60) Provisional application No. 61/798,127, filed on Mar. 15, 2013.

(51) Int. Cl.
*C23C 16/44* (2006.01)
*C23C 16/455* (2006.01)
(Continued)

(52) U.S. Cl.
CPC .... *C23C 16/45557* (2013.01); *C23C 16/4409* (2013.01); *C23C 16/4584* (2013.01); *C23C 16/45544* (2013.01); *C23C 16/45563* (2013.01); *C23C 16/45565* (2013.01); *C23C 16/45574* (2013.01); *H01L 21/6719* (2013.01); *H01L 21/67126* (2013.01); *H01L 21/68785* (2013.01); *H01J 37/32458* (2013.01); *H01J 37/32513* (2013.01); *H01J 37/32605* (2013.01)

(58) Field of Classification Search
None
See application file for complete search history.

(56) References Cited

U.S. PATENT DOCUMENTS

| 4,384,938 A * | 5/1983 | Desilets | C23F 4/00 |
| | | | 156/345.33 |
| 4,600,464 A * | 7/1986 | Desilets | H01J 37/32633 |
| | | | 156/345.45 |

(Continued)

FOREIGN PATENT DOCUMENTS

| CN | 101665921 A | 3/2010 |
| JP | 2010-147052 | 7/2010 |

(Continued)

OTHER PUBLICATIONS

PCT International Preliminary Report on Patentability in PCT/US2014/027196, dated Sep. 24, 2015, 8 pages.

(Continued)

*Primary Examiner* — Jeffrie R Lund
*Assistant Examiner* — Stanislav Antolin
(74) *Attorney, Agent, or Firm* — Servilla Whitney LLC

(57) ABSTRACT

Processing chambers including lid assemblies which form a volume above an injector assembly to decrease the deflection of the injector assembly as a result of the pressure differential between the processing side of the injector assembly and the atmospheric side of the injector assembly.

19 Claims, 4 Drawing Sheets

(51) Int. Cl.
*C23C 16/458* (2006.01)
*H01L 21/67* (2006.01)
*H01L 21/687* (2006.01)
*H01J 37/32* (2006.01)

(56) References Cited

U.S. PATENT DOCUMENTS

| | | | |
|---|---|---|---|
| 6,499,425 B1 * | 12/2002 | Sandhu | C23C 16/34 118/723 E |
| 6,700,089 B1 * | 3/2004 | Hirooka | H01J 37/32568 156/345.27 |
| D654,882 S * | 2/2012 | Honma | D13/182 |
| D654,883 S * | 2/2012 | Honma | D13/182 |
| D654,884 S * | 2/2012 | Honma | D13/182 |
| D655,257 S * | 3/2012 | Honma | D13/182 |
| D655,259 S * | 3/2012 | Honma | D13/182 |
| D655,260 S * | 3/2012 | Honma | D13/182 |
| D655,261 S * | 3/2012 | Honma | D13/182 |
| 9,267,204 B2 | 2/2016 | Honma | |
| 2002/0100555 A1 * | 8/2002 | Hao | H01J 37/32568 156/345.33 |
| 2002/0102858 A1 * | 8/2002 | Wicker | H01J 37/321 438/731 |
| 2003/0098372 A1 * | 5/2003 | Kim | C23C 16/45525 239/548 |
| 2003/0207032 A1 * | 11/2003 | Ahn | C23C 16/4412 427/255.34 |
| 2004/0000378 A1 * | 1/2004 | Lee | H01L 21/6719 156/345.51 |
| 2004/0025787 A1 * | 2/2004 | Selbrede | C23C 16/40 118/715 |
| 2004/0052972 A1 * | 3/2004 | Schmitt | C23C 16/4412 427/569 |
| 2004/0187784 A1 * | 9/2004 | Sferlazzo | C23C 16/45508 118/719 |
| 2004/0200413 A1 * | 10/2004 | Lee | C23C 16/455 118/715 |
| 2004/0247787 A1 * | 12/2004 | Mackie | C23C 16/40 427/248.1 |
| 2005/0000423 A1 * | 1/2005 | Kasai | C23C 16/45565 118/715 |
| 2005/0000430 A1 * | 1/2005 | Jang | C23C 16/45565 118/715 |
| 2005/0092247 A1 * | 5/2005 | Schmidt | C23C 16/45512 118/715 |
| 2005/0279456 A1 * | 12/2005 | Wanka | H01J 37/32009 156/345.38 |
| 2006/0054280 A1 * | 3/2006 | Jang | C23C 16/45565 156/345.34 |
| 2006/0060138 A1 * | 3/2006 | Keller | C23C 16/45565 118/715 |
| 2006/0070571 A1 * | 4/2006 | Garcia | C23C 16/45565 118/300 |
| 2006/0073276 A1 * | 4/2006 | Antonissen | C23C 16/4412 427/248.1 |
| 2006/0137607 A1 * | 6/2006 | Seo | C23C 16/14 118/715 |
| 2006/0213438 A1 * | 9/2006 | Ishizaka | C23C 16/4404 118/715 |
| 2007/0044716 A1 * | 3/2007 | Tetsuka | H01J 37/32082 118/723 I |
| 2007/0131168 A1 * | 6/2007 | Gomi | C23C 16/45565 118/715 |
| 2007/0178810 A1 * | 8/2007 | Choi | B24C 1/003 451/38 |
| 2007/0181181 A1 * | 8/2007 | Mizusawa | C23C 16/45565 137/1 |
| 2007/0215036 A1 * | 9/2007 | Park | C23C 16/45551 117/88 |
| 2007/0218702 A1 * | 9/2007 | Shimizu | C23C 16/06 438/758 |
| 2008/0016684 A1 * | 1/2008 | Olechnowicz | H01L 21/67103 29/748 |
| 2008/0096369 A1 * | 4/2008 | Strzyzewski | C23C 16/45551 438/478 |
| 2008/0226842 A1 * | 9/2008 | Vukovic | C23C 16/45551 427/595 |
| 2009/0061083 A1 * | 3/2009 | Chiang | C23C 16/45544 427/248.1 |
| 2009/0071403 A1 * | 3/2009 | Choi | C23C 16/24 118/722 |
| 2009/0101069 A1 * | 4/2009 | Anwar | C23C 16/45565 118/723 E |
| 2009/0104351 A1 * | 4/2009 | Kakegawa | C23C 16/34 427/248.1 |
| 2009/0129997 A1 * | 5/2009 | Chae | C23C 16/4583 422/186.21 |
| 2009/0130825 A1 * | 5/2009 | Nakamura | H01L 21/67103 438/478 |
| 2009/0236041 A1 * | 9/2009 | Iizuka | C23C 16/4412 156/345.34 |
| 2010/0050942 A1 * | 3/2010 | Kato | C23C 16/401 118/730 |
| 2010/0055316 A1 | 3/2010 | Honma | |
| 2010/0055317 A1 | 3/2010 | Kato et al. | |
| 2010/0112212 A1 * | 5/2010 | Zhang | C23C 16/45565 427/248.1 |
| 2010/0116209 A1 * | 5/2010 | Kato | C23C 16/45551 118/730 |
| 2010/0210092 A1 * | 8/2010 | You | C23C 16/24 438/478 |
| 2010/0288197 A1 * | 11/2010 | Choi | C23C 16/4404 118/723 R |
| 2011/0005684 A1 * | 1/2011 | Hayami | H01J 37/321 156/345.35 |
| 2011/0039026 A1 * | 2/2011 | Kato | C23C 16/402 427/255.26 |
| 2011/0146577 A1 * | 6/2011 | Anwar | C23C 16/45565 118/723 R |
| 2011/0155056 A1 * | 6/2011 | Kato | C23C 16/45538 118/719 |
| 2011/0155057 A1 * | 6/2011 | Kato | C23C 16/45519 118/719 |
| 2011/0159187 A1 * | 6/2011 | Kato | C23C 16/45544 427/255.26 |
| 2011/0197814 A1 * | 8/2011 | Baek | C23C 16/45565 118/723 E |
| 2011/0256726 A1 * | 10/2011 | Lavoie | C23C 16/045 438/702 |
| 2011/0256734 A1 * | 10/2011 | Hausmann | C23C 16/045 438/776 |
| 2011/0284100 A1 * | 11/2011 | Kudela | C23C 16/45565 137/343 |
| 2011/0315320 A1 * | 12/2011 | Do | C23C 16/45565 156/345.34 |
| 2012/0027918 A1 * | 2/2012 | Tiner | C23C 16/45565 427/58 |
| 2012/0052693 A1 * | 3/2012 | Ozaki | C23C 16/402 438/771 |
| 2012/0073756 A1 | 3/2012 | Yamazawa | |
| 2012/0077349 A1 * | 3/2012 | Li | C23C 16/45542 438/762 |
| 2012/0094011 A1 * | 4/2012 | Hishiya | C23C 16/40 427/8 |
| 2012/0174866 A1 * | 7/2012 | Huh | C23C 16/45559 118/725 |
| 2012/0225207 A1 * | 9/2012 | Yudovsky | C23C 16/45551 427/255.5 |
| 2012/0301616 A1 * | 11/2012 | Endo | C23C 16/45565 427/255.7 |
| 2013/0004681 A1 * | 1/2013 | Tso | C23C 16/45565 427/569 |
| 2013/0047923 A1 * | 2/2013 | Kato | H01L 21/02164 118/723 AN |
| 2013/0052371 A1 * | 2/2013 | Higashi | C23C 16/45565 427/585 |
| 2013/0059415 A1 * | 3/2013 | Kato | C23C 16/345 438/106 |

(56) References Cited

U.S. PATENT DOCUMENTS

| | | | | |
|---|---|---|---|---|
| 2013/0061804 A1* | 3/2013 | Enomoto | ............ | H01L 21/6719 |
| | | | | 118/719 |
| 2013/0074770 A1* | 3/2013 | Honma | ................ | C23C 16/401 |
| | | | | 118/719 |
| 2013/0180452 A1* | 7/2013 | Kato | .................... | C23C 16/458 |
| | | | | 118/719 |
| 2013/0203268 A1* | 8/2013 | Kato | ................ | H01L 21/02263 |
| | | | | 438/778 |
| 2013/0206067 A1* | 8/2013 | Kato | ................ | H01L 21/02104 |
| | | | | 118/719 |
| 2014/0011370 A1* | 1/2014 | Kato | .................. | H01L 21/0206 |
| | | | | 438/782 |
| 2014/0141619 A1* | 5/2014 | Sawada | ............ | H01J 37/32091 |
| | | | | 438/711 |
| 2015/0345022 A1* | 12/2015 | Yudovsky | ......... | C23C 16/45551 |
| | | | | 438/14 |

FOREIGN PATENT DOCUMENTS

| | | | | |
|---|---|---|---|---|
| KR | 10-2009-0102257 | | 9/2009 | |
| WO | WO-2014130673 A1 * | | 8/2014 | ....... C23C 16/45551 |

OTHER PUBLICATIONS

PCT International Search Report and Written Opinion in PCT/US2014/027196, dated Jul. 10, 2014, 11 pages.

* cited by examiner

ATMOSPHERIC LID WITH RIGID PLATE FOR CAROUSEL PROCESSING CHAMBERS

FIELD

Embodiments of the invention generally relate to process chamber lids. More particularly, embodiments of the disclosure are directed to process chamber lids that prevent deformation of the gas distribution assembly during low pressure processing.

BACKGROUND

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The effectiveness of a substrate processing platform, or system, is often quantified by cost of ownership (COO). The COO, while influenced by many factors, is largely affected by the system footprint, i.e., the total floor space required to operate the system in a fabrication plant, and system throughput, i.e., the number of substrates processed per hour. Footprint typically includes access areas adjacent the system that are required for maintenance. Hence, although a substrate processing platform may be relatively small, if it requires access from all sides for operation and maintenance, the system's effective footprint may still be prohibitively large.

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, it may be necessary to use an ALD process. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form a uniform material layer on the surface of a substrate. Cycles of reactive precursor and inert purge gases are repeated to form the material layer to a desired thickness. The biggest drawback with ALD techniques is that the deposition rate is much lower than typical CVD techniques by at least an order of magnitude. For example, some ALD processes can require a chamber processing time from about 10 to about 200 minutes to deposit a high quality layer on the surface of the substrate. In choosing such ALD and epitaxy processes for better device performance, the cost to fabricate devices in a conventional single substrate processing chamber would increase due to very low substrate processing throughput. Hence, when implementing such processes, a continuous substrate processing approach is needed to be economically feasible.

New generations of ALD process tools require a tight control of the gap between the wafer and the deposition source (injector) to meet composition and thickness uniformity across the wafer and between wafers. The process may take place in a wide range of temperatures, and in a range of separation between the wafer and the deposition source. It can be important to monitor the uniformity of the distance across the wafers area, which can be as large as 1-2 meters in diameter.

During low temperature processing, the upper injector assembly has excessive pressure greater than about 1.3 mm at 1 atmosphere. This deflection is too large, resulting in non-uniformity of the deposited films. There is a need in the art for apparatus and methods of low pressure processing chamber while minimizing the effect of thermal differences between the chamber lid and chamber body.

SUMMARY

One or more embodiments of the invention are directed to processing chambers comprising a chamber body, a susceptor assembly, an injector assembly and a chamber lid. The chamber body includes a bottom wall and a sidewall. The susceptor assembly is in the chamber body to support and rotate a plurality of substrates around a central axis and has a top surface. The injector assembly is positioned above the susceptor assembly and has a back surface and a front surface facing the top surface of the susceptor assembly and defining a process volume. An outer peripheral edge of the injector assembly supports the injector assembly on the sidewall of the chamber body. The chamber lid comprises a top wall and sidewall. The sidewall is connectable to the chamber body sidewall. The top surface of the injector assembly and the chamber lid top wall and sidewall define a lid volume.

In some embodiments, wherein the sidewall of the chamber body has a ledge, the outer peripheral edge of the injector assembly supported by the ledge. In one or more embodiments, the injector assembly further comprises a plurality of pegs at the outer peripheral edge extending from the front surface, the plurality of pegs positioned on the ledge of the sidewall to support the injector assembly. In some embodiments, the pegs comprise a material with a coefficient of thermal expansion that matches the injector assembly. In one or more embodiments, a gap between the injector assembly and the susceptor assembly remains substantially the same over temperatures up to about 550° C.

In some embodiments, the process volume and the lid volume are in fluid communication so that both have about the same pressure during processing. One or more embodiments further comprise a vacuum source in communication with the process volume to lower the pressure in the process volume.

In some embodiments, the sidewall of the chamber lid comprises a lip extending inwardly from the sidewall to cover a portion of the back surface of the injector assembly. In one or more embodiments, the lip forms a fluid tight seal with the back surface of the injector assembly. Some embodiments further comprise a vacuum source in communication the process volume and a vacuum source in communication with the lid volume. In one or more embodiments, the vacuum source is the same for both the process volume and the lid volume and pressure in the lid volume can be controlled separately from the process volume.

In some embodiments, the injector assembly is disc-shaped with a diameter greater than about 1 meter. In one or more embodiments, the susceptor assembly further comprises a plurality of recesses to support a plurality of substrates. In some embodiments, each of the recesses is sized to support a substrate so a top surface of the substrate is substantially coplanar with a top surface of the susceptor assembly.

In some embodiments, the top wall of the chamber lid is spaced in the range of about 5 mm to about 0.5 meters above the back surface of the injector assembly.

In one or more embodiments, the injector assembly comprises a plurality of gas ports extending radially from an inner peripheral region of the injector assembly toward the outer peripheral edge of the injector assembly, each gas port being wider at the outer peripheral region than the inner peripheral region and having an opening at the front surface of the injector assembly to provide a plurality of gas streams toward the top surface of the susceptor assembly.

In some embodiments, when the process volume has a pressure in the range of about 1 mTorr to about 30 Torr, the injector assembly deflects less than about 0.2 mm.

Additional embodiments of the invention are directed to processing chambers comprising a chamber body, a susceptor assembly, an injector assembly and a chamber lid. The chamber body includes a bottom wall and a sidewall including a ledge. The susceptor assembly is in the chamber body to support and rotate a plurality of substrates around a central axis. The susceptor assembly has a top surface including a plurality of recesses to support a plurality of substrates. The injector assembly is positioned above the susceptor assembly and has a back surface and a front surface facing the top surface of the susceptor assembly and defining a process volume. An outer peripheral edge of the injector assembly supports the injector assembly on the ledge of the sidewall of the chamber body. The injector assembly includes a plurality of radially disposed gas ports having an opening at the front surface, each of the gas ports extending from an inner peripheral region toward the outer peripheral edge and being wider at the outer edge than the inner region. The chamber lid comprises a top wall and sidewall. The sidewall is connectable to the chamber body sidewall, the top surface of the injector assembly and the chamber lid top wall and sidewall defining a lid volume.

In some embodiments, the injector assembly further comprises a plurality of pegs at the outer peripheral edge extending from the front surface, the plurality of pegs positioned on the ledge of the sidewall to support the injector assembly. In one or more embodiments, the pegs comprise a material with a coefficient of thermal expansion that matches the injector assembly.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
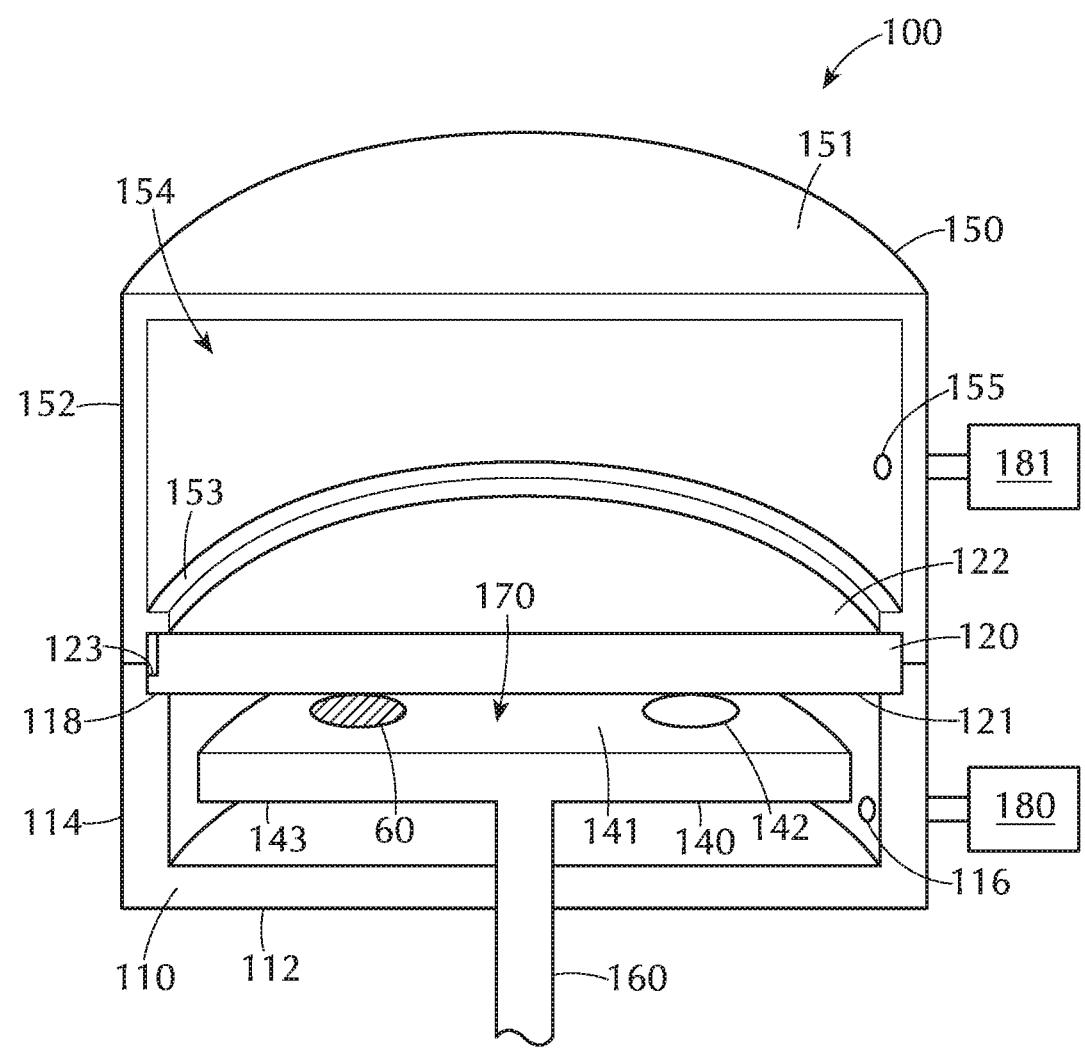
FIG. 1 shows a partial perspective view of a processing chamber in accordance with one or more embodiment of the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention are directed to processing chambers with an upper dome assembly which is added to reduce the pressure across the injector assembly. The upper section above the injector assembly can be held at the same pressure as the lower chamber or pressure can be controlled independently. Additionally, in some embodiments, pegs are added to the injector assembly to match the thermal expansion of the injector's body to maintain the gap between the injector assembly and susceptor. As the injectors expand downward, the backing plate and pegs expand upward by the same magnitude maintaining the same gap between the susceptor and injector.

FIG. 1 shows a partial perspective view of an embodiment of a processing chamber 100 including a chamber body 110 and a chamber lid 150. The chamber body includes a bottom wall 112 and a sidewall 114. A port 116 may be in the sidewall 114 and connected to a gas cabinet 180 which is capable of pumping or purging the chamber body with various gases.

An injector assembly 120, also referred to as a gas distribution assembly, is positioned within the chamber. The injector assembly 120 is above the susceptor assembly 140. The injector assembly 120 has a front surface 121 which faces the susceptor assembly 140 and a back surface 122. An outer peripheral region 123 of the injector assembly 120 supports the entire injector assembly 120 on a top portion of the chamber body 110 sidewall 114. The left side of the injector assembly 120 is shown with a profiled edge while the right side is shown without a straight edge. Either edge, or other edge profiles, can be employed. In some embodiments, like that shown in FIG. 1, the sidewall 114 includes a ledge 118. The ledge 118 can be formed by a recessed area in the wall (see FIG. 1) or can extend inwardly from the side wall into the chamber interior.

Figure 2:
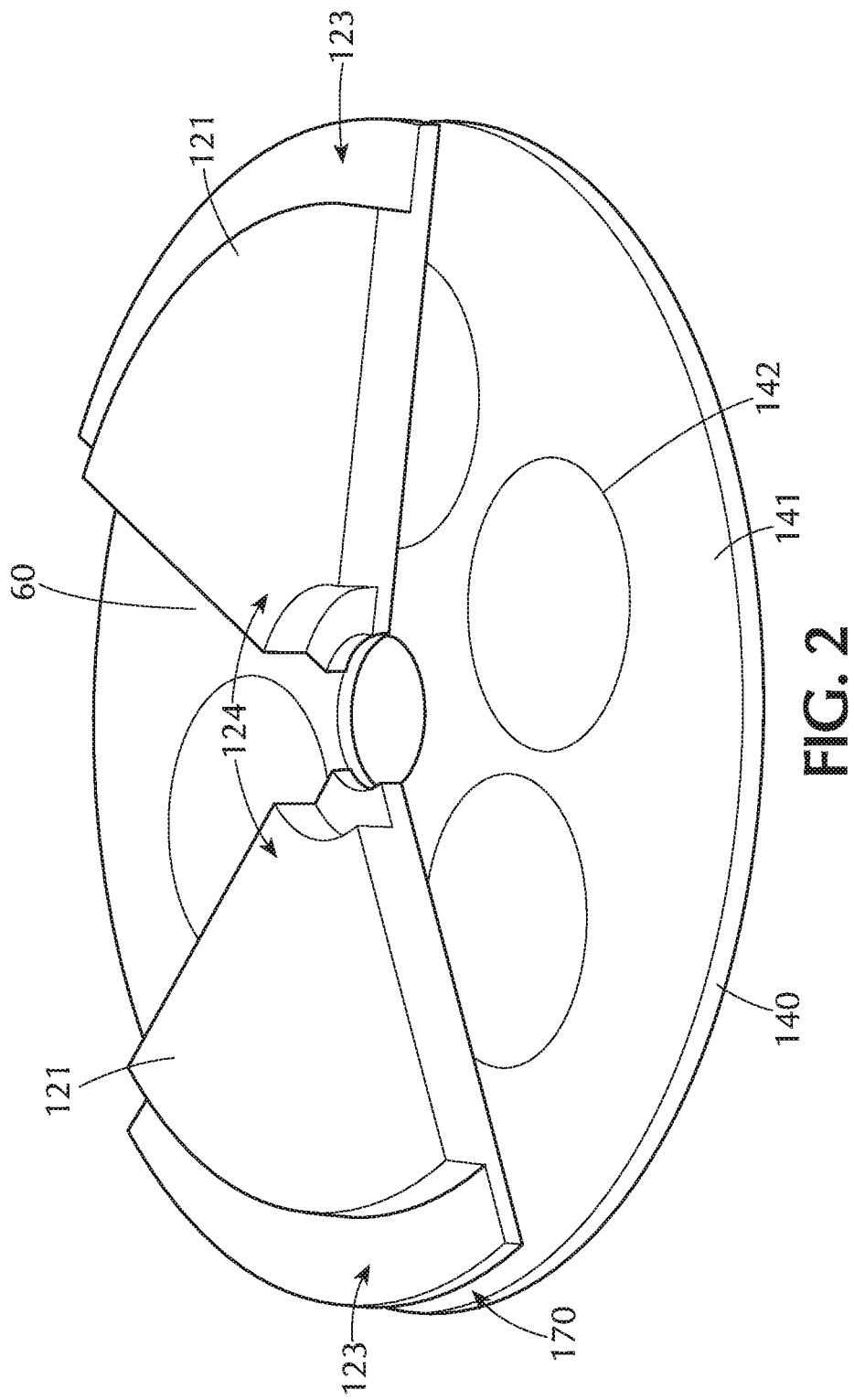
FIG. 2 shows a partial view of an injector assembly and susceptor assembly in accordance one or more embodiment of the invention.

The processing chamber 100 shown in the Figures is a carousel-type chamber in which the susceptor assembly 140 can hold a plurality of wafers 60. As shown in FIG. 2, the injector assembly 120 may include a plurality of separate injector units 121, each injector unit 121 being capable of depositing a film on the wafer, as the wafer is moved beneath the injector unit. Two pie-shaped injector units 121 are shown positioned on approximately opposite sides of and above the susceptor assembly 140. This number of injector units 121 is shown for illustrative purposes only and to provide an appreciation for the stacked nature of the susceptor assembly 140 and injector assembly 120. It will be understood that more or less injector units 121 can be included and that in some embodiments, the injector assembly 120 is a single piece not made up of a plurality of pie-shaped units. In some embodiments, there are a sufficient number of pie-shaped injector units 121 to form a shape conforming to the shape of the susceptor assembly 140.

Figure 3:
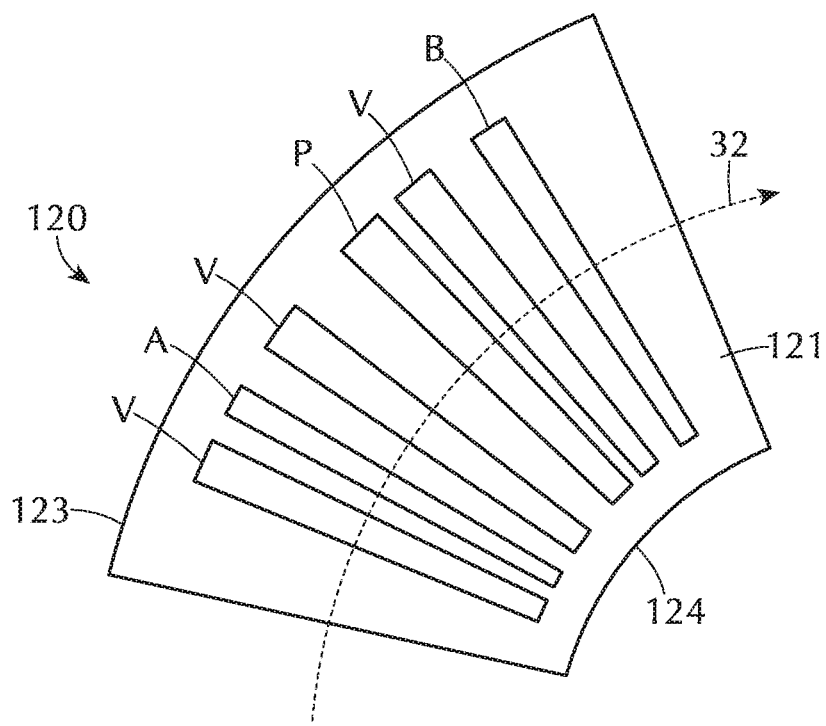
FIG. 3 shows a partial front view of a segment of an injector assembly in accordance one or more embodiment of the invention.

Referring to FIG. 3, the injector assembly 120 comprises a plurality of gas ports extending radially from an inner peripheral region 124 of the injector assembly 120 toward the outer peripheral region 123. Each gas port is wider at the outer peripheral region 123 than the inner peripheral region 124 and has an opening at the front surface 121 of the injector assembly 120 to provide a plurality of gas streams toward the top surface of the susceptor assembly 140.

The injector assembly 120 shown in FIG. 3 is either a portion of a large circular (or disc-shaped) injector assembly 120, or an individual pie-shaped segment which can be combined with others to form a disc-shaped injector assembly 120. As used in this specification and the appended claims, the term "pie-shaped" is used to describe a body that is a generally circular sector. For example, a pie-shaped segment may be one-quarter of a circle or disc-shaped object. The inner edge of the pie-shaped segment can come to a point or can be truncated to a flat edge or rounded like the sector shown in FIG. 3. The entire injector assembly 120 can be quite large and can be, for example, wider than about 1 meter in diameter or wider than about 1.5 meters in diameter. In some embodiments, the injector assembly 120 is in the range of about 1 to about 2 meters in diameter.

Still referring to FIG. 3, in operation, a substrate would be passed across this gas distribution assembly 120 in an arc shape path 32. In passing, each point of the substrate would be exposed to a vacuum port V, a first reactive gas port A, a vacuum port V, a purge port P, a vacuum port V and a second reactive gas port B. The pattern shown will expose all parts of the substrate to two reactive gases and maintain separation of the gases to prevent gas phase reactions.

Each of the individual gas ports has a narrower width near the inner peripheral region 124 of the gas distribution assembly 120 and a larger width near the outer peripheral region 123. The shape or aspect ratio of the individual ports can be proportional to, or different from, the shape or aspect ratio of the gas distribution assembly 120 segment. In some embodiments, the individual ports are shaped so that each point of a wafer passing across the gas distribution assembly 120 following path 32 would have about the same residence time under each gas port. The path of the substrates can be perpendicular to the gas ports. In some embodiments, each of the gas distribution assemblies comprises a plurality of elongate gas ports which extend in a direction substantially perpendicular to the path traversed by a substrate. As used in this specification and the appended claims, the term "substantially perpendicular" means that the general direction of movement is approximately perpendicular to the axis of the gas ports. For a pie-shaped gas port, the axis of the gas port can be considered to be a line defined as the mid-point of the width of the port extending along the length of the port.

Figure 4:
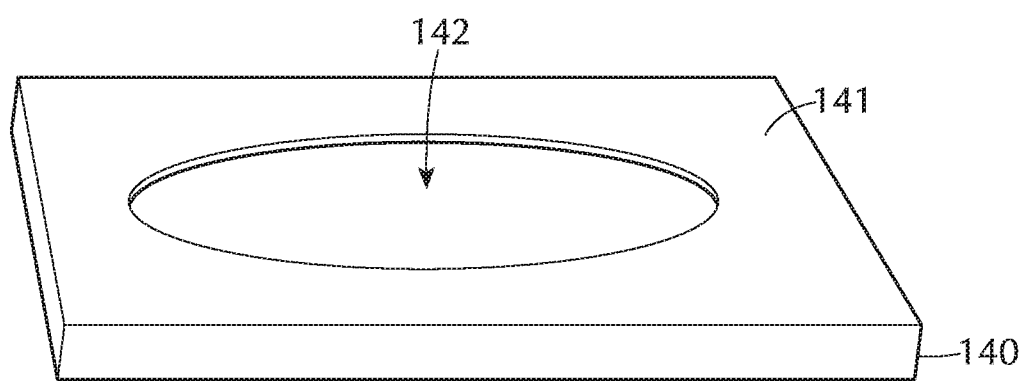
FIG. 4 show a perspective view of a portion of a susceptor assembly in accordance one or more embodiment of the invention.

A susceptor assembly 140 is positioned within the chamber body 110 beneath a gas distribution assembly 120. The susceptor assembly 140 shown in FIG. 1 is a disc-shaped component. FIG. 4 shows a square cutout of a portion of the susceptor assembly 140. With reference to FIGS. 1 and 4, the susceptor assembly 140 includes a top surface 141 and at least one recess 142 in the top surface 141 and a bottom surface 143. The recess 142 can be any suitable shape and size depending on the shape and size of the wafers 60 being processed. In the embodiment shown in FIG. 1, the recess 142 has a flat bottom to support the bottom of the wafer, but it will be understood that the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, the recess 142 in the top surface 141 of the susceptor assembly 140 is sized so that a wafer 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 160 and the injector assembly 120, moving the susceptor assembly 140 into proper position to set the gap between the injector assembly 120 and the susceptor assembly 140. The gap is also referred to as the process volume 170. This is the region where the wafers are exposed to the reactive gases and processed.

In some embodiments, the gap distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

Rotation of the carousel (e.g., the susceptor assembly 140) can be continuous or discontinuous. In continuous processing, the wafers are constantly rotating so that they are exposed to each of the gas port (also called injectors) in turn. In discontinuous processing, the wafers can be repeatedly moved and stopped. For example, the carousel can rotate so that the wafers move from a region in front an injector to a region after the injector. Pausing between the injectors may provide time for additional processing steps between each layer deposition (e.g., exposure to plasma).

Referring back to FIG. 1, the processing chamber 100 includes a chamber lid 150. The lid includes a top wall 151 and a sidewall 152 which can be connected to the chamber body sidewall 114. When the chamber lid 150 is on the chamber body, a lid volume 154 is defined by the lid top wall 151, lid sidewall 152 and back surface 122 of the injector assembly 120. The dimensions of the lid volume 154 can vary depending on the height of the lid walls, and the diameter of the lid and injector assembly. In some embodiments, the size of the lid volume is minimized to avoid having too much volume within the chamber that might need to be purged.

The lid 150 may include port 155 connected to a gas cabinet 181 which can be used to purge or pump down the lid volume 154. To avoid deflection of the injector assembly when under processing conditions, it may be desirable to lower the pressure in the lid volume 154 using the gas cabinet 181. Gas cabinet 180 and gas cabinet 181 can be the same cabinet with different connections to the chamber parts. The pressure in the lid volume 154 does not need to be the same as the pressure in process volume 170, but can be lowered to relieve the pressure differential that would otherwise form between the region above the injector assembly and the region below the injector assembly. In some embodiments, the top wall 151 of the chamber lid 150 is spaced in the range of about 5 mm to about 0.5 meters above the back surface 122 of the injector assembly 120.

Figure 5:
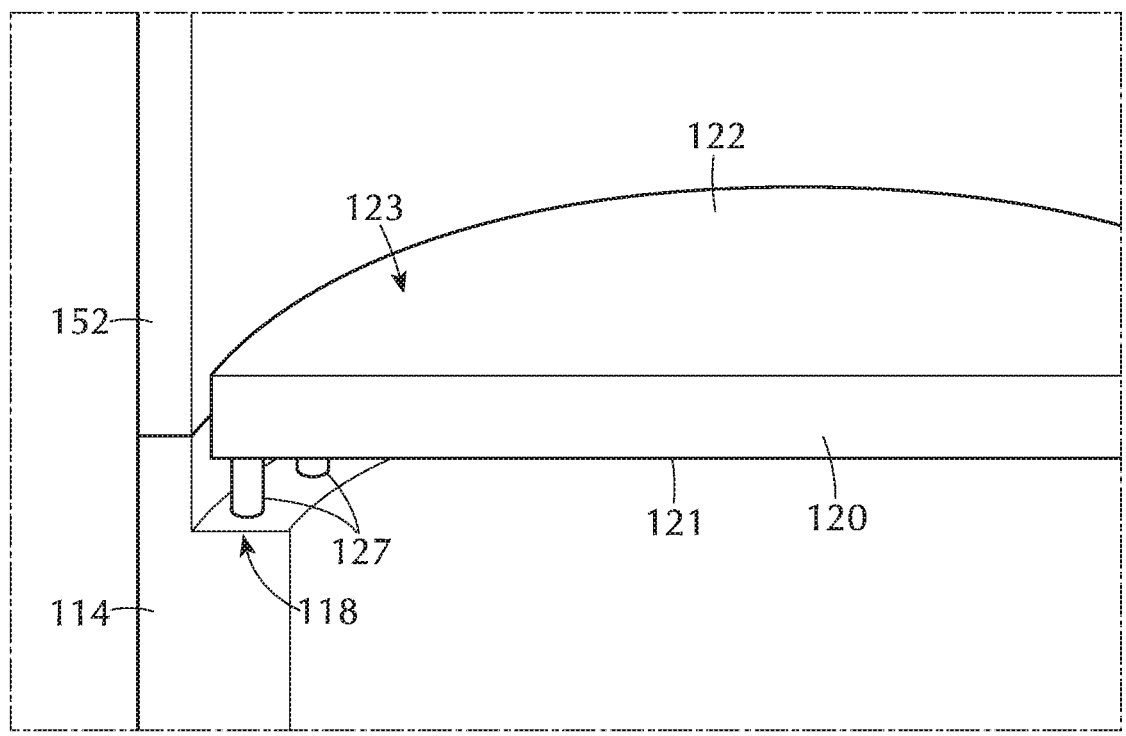
FIG. 5 shows a partial cross-sectional perspective view of a processing chamber in accordance with one or more embodiments of the invention.

Referring to FIG. 5, some embodiments of the injector assembly 120 include a plurality of pegs 127 which can act as feet. The pegs 127 are positioned at the outer peripheral region 123 of the injector assembly 120 and extend from the front surface 121. The injector assembly can be positioned in the chamber to rest on these pegs and the pegs can be positioned on the ledge 118 of the sidewall 114. The pegs 127 can be made out of any suitable material, either conductive or insulating. In some embodiments, the pegs 127 comprise a material with a coefficient of thermal expansion that matches the injector assembly 120. In these embodiments, as the injector assembly 120 expands downward, the backing plate (back side of the injector assembly) and the pegs 127 expand upward by the same magnitude maintaining the same gap between susceptor assembly 140 and injector assembly 120. In some embodiments, a gap between the injector assembly and the susceptor assembly remains substantially the same over temperatures up to about 550° C.

It can be seen from FIG. 5, that when the injector assembly is sitting on pegs 127, there can be a gap around the edges of the injector assembly 120. This can allow fluid communication between the process volume and the lid volume so that a single pumping system would lower the pressure in both volumes at the same time.

The lid 150 can also include a lip 153, shown in FIG. 1, extending inwardly from the sidewall 152. The lid 150 can cover a portion of the back surface 122 of the injector assembly 120. In some embodiments, the lip 153 forms a fluid tight seal with the back surface of the injector assembly 120 so that the process volume and lid volume remain isolated from each other.

While the foregoing is directed to embodiments of the present invention, other and further embodiments of the invention may be devised without departing from the basic scope thereof, and the scope thereof is determined by the claims that follow.

What is claimed is:

1. A processing chamber comprising:
a chamber body including a bottom wall and a sidewall;
a susceptor assembly in the chamber body to support and rotate a plurality of substrates around a central axis, the susceptor assembly having a top surface;
an injector assembly positioned above the susceptor assembly and having a back surface and a front surface facing the top surface of the susceptor assembly and defining a process volume, an outer peripheral edge of the injector assembly supporting the injector assembly on the sidewall of the chamber body; and
a chamber lid comprising a top wall and sidewall, the sidewall connectable to the chamber body sidewall, the back surface of the injector assembly and the chamber lid top wall and sidewall enclosing a lid volume.

2. The processing chamber of claim 1, wherein the sidewall of the chamber body has a ledge, the outer peripheral edge of the injector assembly supported by the ledge.

3. The processing chamber of claim 2, wherein the injector assembly further comprises a plurality of pegs at the outer peripheral edge extending from the front surface, the plurality of pegs positioned on the ledge of the sidewall to support the injector assembly.

4. The processing chamber of claim 3, wherein the pegs comprise a material with a coefficient of thermal expansion that matches the injector assembly.

5. The processing chamber of claim 4, wherein a gap between the injector assembly and the susceptor assembly remains substantially the same over temperatures up to about 550° C.

6. The processing chamber of claim 3, wherein the process volume and the lid volume are in fluid communication so that both have about the same pressure during processing.

7. The processing chamber of claim 6, further comprising a vacuum source in communication with the process volume to lower the pressure in the process volume.

8. The processing chamber of claim 3, wherein the sidewall of the chamber lid comprises a lip extending inwardly from the sidewall to cover a portion of the back surface of the injector assembly.

9. The processing chamber of claim 8, wherein the lip forms a fluid tight seal with the back surface of the injector assembly.

10. The processing chamber of claim 8, further comprising a vacuum source in communication the process volume and a vacuum source in communication with the lid volume.

11. The processing chamber of claim 10, wherein the vacuum source is the same for both the process volume and the lid volume and pressure in the lid volume can be controlled separately from the process volume.

12. The processing chamber of claim 1, wherein the injector assembly is disc-shaped with a diameter greater than about 1 meter.

13. The processing chamber of claim 1, wherein the top wall of the chamber lid is spaced in the range of about 5 mm to about 0.5 meters above the back surface of the injector assembly.

14. The processing chamber of claim 1, wherein when the process volume has a pressure in the range of about 1 mTorr to about 30 Torr, the injector assembly deflects less than about 0.2 mm.

15. A processing chamber comprising:
a chamber body including a bottom wall and a sidewall including a ledge;
a susceptor assembly in the chamber body to support and rotate a plurality of substrates around a central axis, the susceptor assembly having a top surface including a plurality of recesses to support a plurality of substrates;
an injector assembly positioned above the susceptor assembly and having a back surface and a front surface facing the top surface of the susceptor assembly and defining a process volume, an outer peripheral edge of the injector assembly supporting the injector assembly on the ledge of the sidewall of the chamber body, the injector assembly including a plurality of radially disposed gas ports having an opening at the front surface, each of the gas ports extending from an inner peripheral region toward the outer peripheral edge and being wider at the outer edge than the inner region; and a chamber lid comprising a top wall and sidewall, the sidewall connectable to the chamber body sidewall, the back surface of the injector assembly and the chamber lid top wall and sidewall enclosing a lid volume.

16. The processing chamber of claim 15, wherein the injector assembly is disc-shaped with a diameter greater than about 1 meter.

17. The processing chamber of claim 15, wherein the top wall of the chamber lid is spaced in the range of about 5 mm to about 0.5 meters above the back surface of the injector assembly.

18. The processing chamber of claim 15, wherein when the process volume has a pressure in the range of about 1 mTorr to about 30 Torr, the injector assembly deflects less than about 0.2 mm.

19. A processing chamber comprising:
a chamber body including a bottom wall and a sidewall with a ledge;
a susceptor assembly in the chamber body to support and rotate a plurality of substrates around a central axis, the susceptor assembly having a top surface;
an injector assembly positioned above the susceptor assembly and having a back surface and a front surface facing the top surface of the susceptor assembly and defining a process volume, an outer peripheral edge of the injector assembly supporting the injector assembly on the ledge of the sidewall of the chamber body, the injector assembly having a plurality of pegs at an outer peripheral edge extending from the front surface, the plurality of pegs positioned on the ledge of the sidewall to support the injector assembly;
a chamber lid comprising a top wall and sidewall, the sidewall connectable to the chamber body sidewall, the back surface of the injector assembly and the chamber lid top wall and sidewall enclosing a lid volume, the lid volume in fluid communication with the process volume so that both the lid volume and the process volume have about the same pressure during processing; and
a vacuum source in fluid communication with the process volume to lower the pressure in the process volume,
wherein a gap between the injector assembly and the susceptor assembly remains substantially the same at temperatures up to about 550° C.

* * * * *